(12) United States Patent
Guyenot et al.

(10) Patent No.: US 8,505,891 B2
(45) Date of Patent: Aug. 13, 2013

(54) METHOD AND DEVICE FOR FASTENING A PLANAR SUBSTRATE, HAVING AN ELECTRIC CIRCUIT OR THE LIKE, IN A MOUNTING POSITION

(75) Inventors: Michael Guyenot, Ludwigsburg (DE); Alexander Geissler, Buergel (DE)

(73) Assignee: Robert Bosch GmbH, Stuttgart (DE)

( * ) Notice: Subject to any disclaimer, the term of this patent is extended or adjusted under 35 U.S.C. 154(b) by 330 days.

(21) Appl. No.: 12/451,807

(22) PCT Filed: May 7, 2008

(86) PCT No.: PCT/EP2008/055653
§ 371 (c)(1),
(2), (4) Date: Jun. 29, 2010

(87) PCT Pub. No.: WO2008/148620
PCT Pub. Date: Dec. 11, 2008

(65) Prior Publication Data
US 2010/0308520 A1 Dec. 9, 2010

(30) Foreign Application Priority Data
Jun. 4, 2007 (DE) .......................... 10 2007 025 957

(51) Int. Cl.
*B23Q 3/08* (2006.01)
*H05K 7/20* (2006.01)
*B65D 25/08* (2006.01)
*H01L 21/687* (2006.01)

(52) U.S. Cl.
USPC .............................. 269/22; 361/704; 206/219

(58) Field of Classification Search
USPC ................... 269/22; 361/704, 816, 818, 807, 361/721; 206/219, 709
See application file for complete search history.

(56) References Cited

U.S. PATENT DOCUMENTS

| | | | | |
|---|---|---|---|---|
| 3,258,649 A | * | 6/1966 | Arguin | 361/807 |
| 4,208,079 A | * | 6/1980 | Prado et al. | 312/202 |
| 4,214,292 A | * | 7/1980 | Johnson | 361/721 |
| 4,400,858 A | * | 8/1983 | Goiffon et al. | 24/546 |
| 4,694,555 A | | 9/1987 | Russell et al. | |
| 4,865,197 A | * | 9/1989 | Craig | 206/709 |
| 4,994,937 A | * | 2/1991 | Morrison | 361/715 |
| 5,009,311 A | | 4/1991 | Schenk | |
| 5,383,098 A | * | 1/1995 | Ma et al. | 361/818 |
| 5,390,083 A | * | 2/1995 | Decker et al. | 361/796 |
| 5,526,232 A | * | 6/1996 | Kolberg et al. | 361/715 |
| 5,731,964 A | * | 3/1998 | Kitakubo et al. | 361/816 |
| 5,914,864 A | * | 6/1999 | MacDonald et al. | 361/752 |
| 6,094,349 A | * | 7/2000 | Fassel et al. | 361/704 |
| 6,222,732 B1 | * | 4/2001 | Jakob et al. | 361/704 |
| 6,272,813 B1 | * | 8/2001 | Sperry et al. | 53/440 |
| 6,341,063 B2 | * | 1/2002 | Kinoshita et al. | 361/690 |

(Continued)

FOREIGN PATENT DOCUMENTS

| | | |
|---|---|---|
| CN | 1381161 | 11/2002 |
| DE | 77 19 878 | 10/1977 |

(Continued)

*Primary Examiner* — Lee D Wilson
*Assistant Examiner* — Alvin Grant
(74) *Attorney, Agent, or Firm* — Kenyon & Kenyon LLP

(57) ABSTRACT

In a method for fastening a planar substrate having an electric circuit at a mounting position on a mounting element, a holding arrangement acts upon the planar substrate to fasten it, an activatable expansion arrangement being used as the holding arrangement.

15 Claims, 3 Drawing Sheets

(56) References Cited

U.S. PATENT DOCUMENTS

| | | | |
|---|---|---|---|
| 6,629,599 B2 * | 10/2003 | Sperry et al. | 206/219 |
| 6,697,257 B1 * | 2/2004 | Wolf et al. | 361/708 |
| 6,781,831 B1 * | 8/2004 | Banton et al. | 361/690 |
| 6,984,133 B2 * | 1/2006 | Naitou et al. | 439/76.2 |
| 7,095,615 B2 * | 8/2006 | Nichols | 361/719 |
| 7,118,646 B2 * | 10/2006 | Hunkeler | 156/293 |
| 7,369,413 B2 * | 5/2008 | Caines et al. | 361/719 |
| 7,578,679 B2 * | 8/2009 | Kinoshita et al. | 439/76.1 |
| 7,623,349 B2 * | 11/2009 | Refai-Ahmed et al. | 361/719 |
| 7,652,892 B2 * | 1/2010 | Shiu et al. | 361/752 |
| 7,813,134 B2 * | 10/2010 | Katsuro | 361/714 |
| 8,071,895 B2 * | 12/2011 | Shiu et al. | 174/521 |

FOREIGN PATENT DOCUMENTS

| | | |
|---|---|---|
| DE | 37 03 681 | 8/1987 |
| DE | 694 00 392 | 12/1996 |
| DE | 695 01 011 | 3/1998 |
| DE | 10 2005 03 6445 | 2/2007 |
| GB | 2164803 | 3/1986 |
| JP | 61-20391 | 1/1986 |
| JP | 61-179599 | 11/1986 |
| JP | 2003-332769 | 11/2003 |
| JP | 2003-533056 | 11/2003 |
| JP | 2004-219648 | 8/2004 |
| JP | 07/099395 | 4/2007 |
| JP | 2007/278395 | 10/2007 |
| WO | WO 01/87029 | 11/1991 |
| WO | WO 95/35015 | 12/1995 |

* cited by examiner

METHOD AND DEVICE FOR FASTENING A PLANAR SUBSTRATE, HAVING AN ELECTRIC CIRCUIT OR THE LIKE, IN A MOUNTING POSITION

BACKGROUND OF THE INVENTION

1. Field of the Invention

The present invention relates to a method and device for fastening a planar substrate, having an electric circuit or the like, in a mounting position on a mounting element, holding means acting upon the planar substrate so as to fasten it.

2. Description of Related Art

Planar substrates having an electric circuit or the like are known, which are developed, for example, as printed circuit boards/mounting plates for the implementation of electronic switching circuits. Such planar substrates, together with the circuit situated on them, should normally be kept at certain mounting positions, for instance, in a construction frame or in housings, the latter particularly being also used for screening the circuit situated on the planar substrate. Such planar substrates, especially printed circuit boards, are currently being mounted in housings in a variety of ways. As a rule, this is done by using screws, by crimping, by clipping or by clamping between two housing parts. The disadvantage is that these fastening methods known from the related art are usually performed over relatively small area sections of the printed circuit board, for instance, a support in the case of screw joints takes place via a screw head that has a small contact surface relative to the overall surface of the printed circuit board. Because of this, relatively high forces are exerted on the printed circuit board locally, which may lead to high stresses. Because of this, the printed circuit board is exposed to a more or less unevenly distributed, very strong mechanical stress, which may have a disadvantageous effect on its service life. Furthermore, the housing forms have to have relatively complicated forms of support for the accommodation of printed circuit boards in a conventional manner, which are used for accommodating screws, for example. Moreover, it is required that the printed circuit board for these conventional fastening methods within the housing all have to be directly accessible. Especially in the case of large area and/or complicated printed circuit boards, the housings must be developed in many parts. This leads to increased costs and increased efforts, especially if these housings have to have increased sealing functions, as is required, for example, in the case of applications under rough environmental conditions, such as in the engine compartments of motor vehicles.

BRIEF SUMMARY OF THE INVENTION

It is an object of the present invention to provide a secure, simple and cost-effective fixing of planar substrates, having an electric circuit, in a mounting element, whereby the disadvantages that were named are avoided.

The present invention provides a method for fastening a planar substrate, having an electric circuit or the like, in a mounting position on a mounting element, holding means acting upon the planar substrate so as to fasten it. In doing this, it is provided that an activatable expansion element be used as the housing means. In this connection, the holding means has the task of applying a force to the planar substrate so as to fasten it in its mounting position on the mounting element. An expansion element that is activatable is used as the holding means. What is meant by this is that, after the application of a certain impulse or after effecting an initial effect, the expansion means begins the expansion process, after it first possessed a non-expanded position. The expansion of the expansion means is, as it were, started or brought about by this activation. The planar substrate may be acted upon over a larger area, or rather a larger section by the expansion means, which leads to a uniform force distribution in the planar substrate, and avoids concentrated loads.

In one example embodiment, the planar substrate is acted upon in a clamping way by the expansion means. This means that the expansion means clamps in the planar substrate, a clamping on both sides being able to take place, or on one side also, particularly using support on the mounting element. This avoids screw joints, clipping, etc.

In one method development, the activation of the expansion means takes place by temperature action, vibrational action and medium application, especially using gases and/or liquids. The expansion means is first of all in its non-expanded position and inactive, so to speak. Only after the application of temperature, vibrations (such as ultrasound), of a medium, especially gases or liquids, does the expansion means begin with the expansion and develops the desired effect. The choice of the activating means, in this instance, depends on the type of expansion means, or rather, from which group of substances the expansion means was selected. In particular, it is also possible to select that specific activating means, of several ones that come into consideration alternatively or cumulatively, which makes possible the simplest and/or most favorable handling for the respective application and the respectively selected expansion means.

In another method development, it is provided that the activating of the expansion means takes place due to a lapse of time. It is possible, for example, to use an expansion means which, at the end of the production process, or after a previous activation having nothing to do with the fastening of the substrate, begins its expansion at a certain time and/or has achieved a certain expansion after a certain time. In this connection, it is then required to monitor the time component in a suitable manner, and to use the appropriately aged expansion means at the right time.

In one method development, it is provided that a chemical, hardening means be used. Such means have the advantage that they are easy to produce and, based on their chemical composition, they permit the abovementioned activating in the desired simple manner. Because these means harden, they reliably fix the fastened planar substrate in its mounting position, without the planar substrate leaving the position again, that it has assumed, after the hardening. A low-vibration or a vibration-free fastening of the planar substrate in its mounting position is thus able to be effected, in particular even after jerking and force application. The force application takes place over a large area while avoiding a concentrated load.

In one example method development, a foam, particularly epoxy foam is used as expansion means. Epoxy foam is known from the related art, and is easily controlled. It may be produced particularly in a composition which has the desired properties for the respective application. In addition, epoxy foam is insulating, so that components and/or printed circuit boards situated on the planar substrate are able to come into contact directly with the epoxy foam.

In another method development, a temperature-activatable means having shape memory is used as the expansion means. Means having shape memory are known as such. Substances are involved, in this instance, which are able to be put into one or more of certain shapes, and which, after being acted upon by a certain impulse or stimulus, assume the one or the other shape. Such means having shape memory are frequently reversible in their assumption of shape, so that a reversible fastening of the planar substrate may also be effected.

In one example method development, a shape memory alloy is used as holding means. A shape memory alloy is a metallic alloy which has the shape memory described, in which, because of the alloy structures, it is established already at the beginning, that is, at the time of production and processing of the shape memory alloy, which geometry is to be assumed before and after the alloy conversion.

In one example method development, a spring element made of shape memory alloy material is used as expansion means. Such spring elements have the advantage that they act on the planar substrate over a relatively large area while applying a spring prestressing in addition to the shape memory-geometry change. In this way, because of the spring action, a vibration-resistant, vibration-secure fastening is additionally achieved.

Moreover, a device is provided, particularly for carrying out the method, having at least one planar substrate having an electric circuit or the like, as described above, which is fastened in a mounting position on a mounting element, a holding means acting upon the planar substrate for the fastening. In doing this, it is provided that the holding means is developed as an activatable expansion element. As was described above on this method, the holding means is an activatable expansion means, that is, one which changes its geometry after an activation, in particular to become larger. After the action of an initial effect, which acts as a start signal, as it were, the expansion means changes in such a way that it reaches out for space. An application of force to the planar substrate is achieved by this enlargement of the expansion means, the expansion means thereby fastening the planar substrate.

In one example embodiment, the mounting element is developed as a mounting housing. In principle, all conceivable mounting elements, known from the related art, come into consideration, thus particularly those which are open on one or more sides or which include, encompass or otherwise hold the planar element only in regions or sections. In particular, for example, the known 19-inch racks or similar mounting elements are conceivable. The mounting elements are preferably developed as mounting housings, that is, housings into which the planar substrate is inserted. The planar substrate is accordingly encompassed at least predominantly in its mounting position in which it is to fastened.

In one example embodiment, the mounting housing has a support for at least one surface of the planar substrate, the holding means acting upon the opposite surface of the planar substrate, in a clamping manner. Consequently, the planar substrate is supported in regions over an area, this support being developed or situated on the inside on the mounting housing. Thus, the planar substrate lies on or at the support, so to speak, over its whole surface area. The area opposite this area of the planar substrate (that is, the other side of the planar substrate) is acted upon in a clamping manner by the holding means. Because of this clamping action, the fastening of the planar substrate comes about via a clamping effect, which comes about between the support on the one hand, namely at the one surface of the planar substrate, and the holding means at the other, opposite surface of the planar substrate on the other hand, the holding means on its part being supported between the planar substrate and a part of the mounting housing, which is opposite to the planar substrate. As a result, the planar substrate is held in this region exclusively by the clamping effect which comes about via the holding means and the support.

In one additional example embodiment, the mounting housing has a base housing and a housing cover. The base housing, in this case, should be understood to be the part of the mounting housing into which the planar substrate is inserted, and which encloses the planar substrate. In particular, we mean in this case a specific embodiment which is open on only one side, this one side being closed by the housing cover.

In one example embodiment, the planar substrate is fastened on the housing cover, and is acted upon by the holding means in the region of the base housing. Accordingly, the holding means is situated in the region of the base housing, but the planar substrate is fastened on the housing cover. This permits inserting the planar substrate into the base housing in a simple manner, via the handling of the housing cover, for instance, by pushing it in, the action by the holding means taking place in the region of the base housing. The holding means is accordingly situated in the base housing or is inserted into it, before the planar substrate is also inserted into the base housing via the handling of the housing cover. After the insertion of the planar substrate, the activation of the holding means, namely the expansion means, is then able to take place, so that the clamping effect, and with that the fastening of the planar substrate, comes about within the base housing. In this way, the cover is also held on the base housing (since the latter is connected to the planar substrate, and the planar substrate is fastened within the base housing. When there is a suitable embodiment of the geometry of the base housing and the housing cover, the cover is also held in a sealing manner in this instance.

In one additional example embodiment, it is provided that the base housing has a geometry in which the holding means is situated in a region that is inaccessible or that is accessible only with difficulty. This is particularly the case if the base housing is developed, for instance, to have a pot shape, and by pot-like one should naturally understand not only those specific embodiments having an essentially circular cross section, but also those having a rectangular or polygonal cross section. It is common to the pot-like specific embodiments that the base housing is closed in its longitudinal extension, and as a result the housing cover is situated at its narrow side/end face, but not at a longitudinal side of the housing. The housing cover is thus relatively small compared to the total extension of the base housing, so that the planar substrate has to be inserted into the depth of the housing. It is frequently desirable, in this connection, that in cases in which the planar substrate is connected to the housing cover, the fastening of the planar substrate takes place on the side opposite the cover (that is, in the depth of the base housing, which is not readily accessible), which, however, can only take place with difficulty or not at all, using the methods of screwing or clipping that are known from the related art. By contrast, if a holding means in the form of an expansion means is inserted there, especially in a manner that the support of the planar substrate is present opposite the holding means, onto which the planar substrate may be placed during its insertion, there comes about a very good clamping and fastening after the activation of the expansion means.

DETAILED DESCRIPTION OF THE INVENTION

Figure 1:
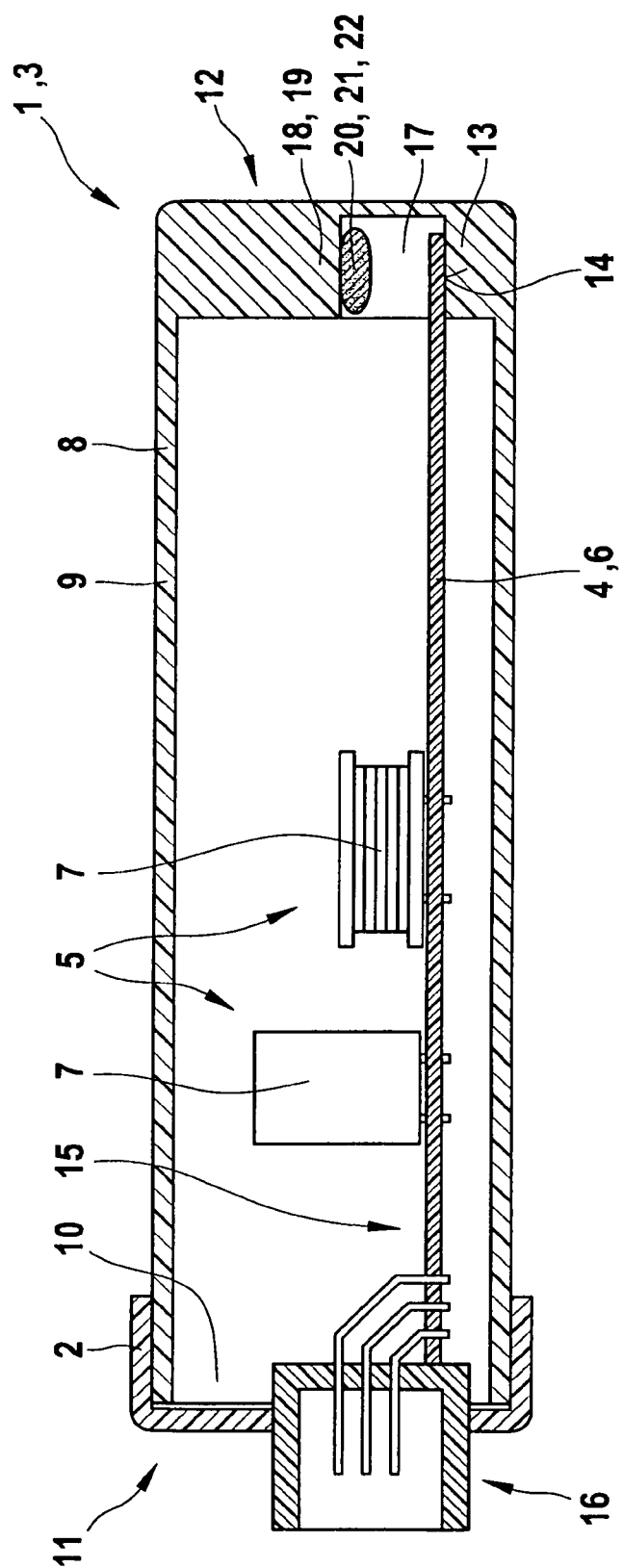
FIG. 1 shows a mounting housing formed of a base housing and a housing cover, having an inserted planar substrate before the activation of the holding means.

FIG. 1 shows an electric circuit 5 situated on a planar substrate 4 in a mounting element 1, namely a mounting housing 3 equipped with a housing cover 2. The electric circuit 5 is soldered, for example, onto planar substrate 4 that is developed as a printed circuit board 6 in this instance, in a systematic arrangement of components 7. Mounting housing 3 is developed as a pot-shaped housing 8, that is, one that has a base housing 9 whose housing opening 10 is situated at a narrow side 11. After the insertion of electric circuit 5 that is situated on planar substrate 4, housing opening 10 is closed using housing cover 2. On housing side 12 that is opposite to housing opening 10, mounting housing 3 has a support 13, on which planar substrate 4, in the mounted position, is supported using a surface 14. As a result, planar substrate 4 is "laid onto" support 13, in a certain way. At the cover side, side 15 of planar substrate 4, planar substrate 4 is connected to housing cover 2, for instance, via a contact plug 16 that extends through housing cover 2 and is firmly soldered to planar substrate 4. Consequently, when housing cover 2 is handled, planar substrate 4 is also submitted to handling because it is mechanically connected to housing cover 2 via contact plug 16, and can thus be moved via housing cover 2. This is especially meaningful for inserting planar substrate 4 into pot-shaped housing 8, since housing cover 2 permits the simple handling of planar substrate 4, particularly its introduction into a clamping region 17, which is formed between support 13 and a counter-support 18 situated at a distance from it and opposite to it, within mounting housing 3. Counter-support 18 is used in this case as a holding means system 19, because on it a holding means 20 is diverted into an opposite position to support 13. Holding means 20 is an expansion means 21, which is present in a non-expanded form. Expansion means 21 is especially an epoxy foam 22. In the present illustration, planar substrate 4 is inserted into mounting housing 3, lying at one side on support 13, and at the other side being held via housing cover 2 that is turned upside down over base housing 9 and contact plug 16 that penetrates housing cover 2. Holding means 20 is not yet functioning at this point.

Figure 2:
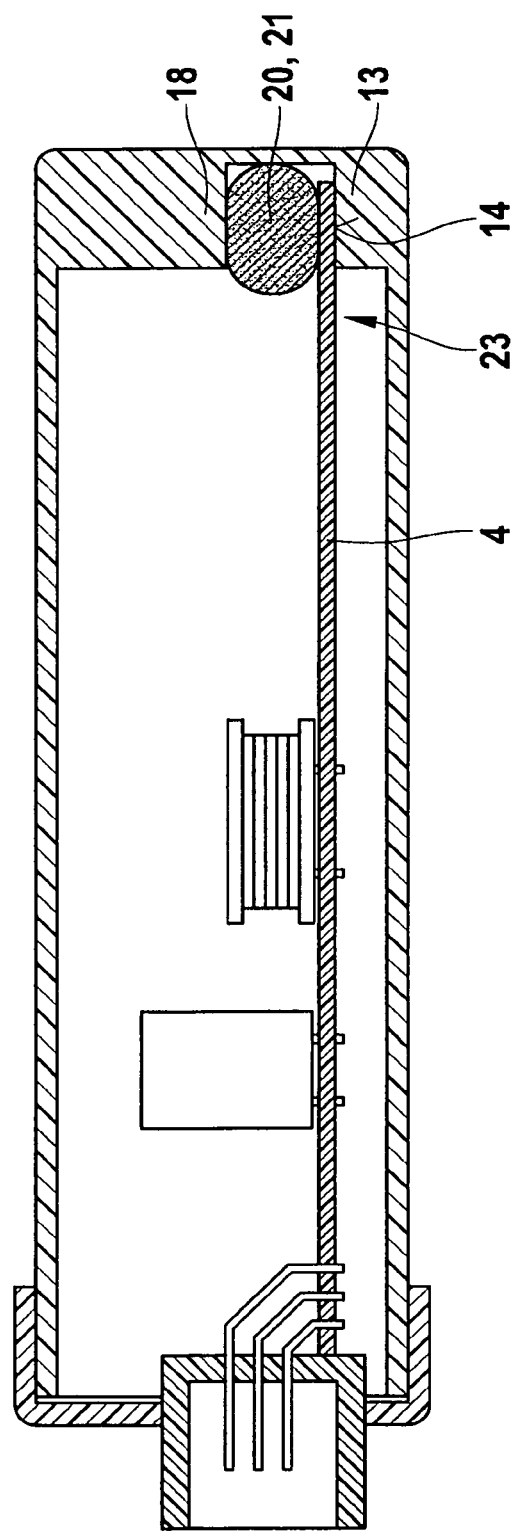
FIG. 2 shows the same housing after the activation of the holding means.

FIG. 2 shows the same system, the planar substrate 4 now being acted upon as holding means 20, at its end 23, opposite housing cover 2, and on its upper side, by expansion means 21 that is now expanded. Expansion means 21 is supported, in this context, on counter-support 18 on one side, and on planar substrate 4 on the other side, planar substrate 4 being supported with its lower-side surface 14, that faces away from expansion means 21, on support 13. Because of this expansion of expansion means 21, namely holding means 20, a clamping effect with respect to planar substrate 4 is thus produced between holding means 20 and support 13, which fastens planar substrate 4 in the mounting position.

Figure 3:
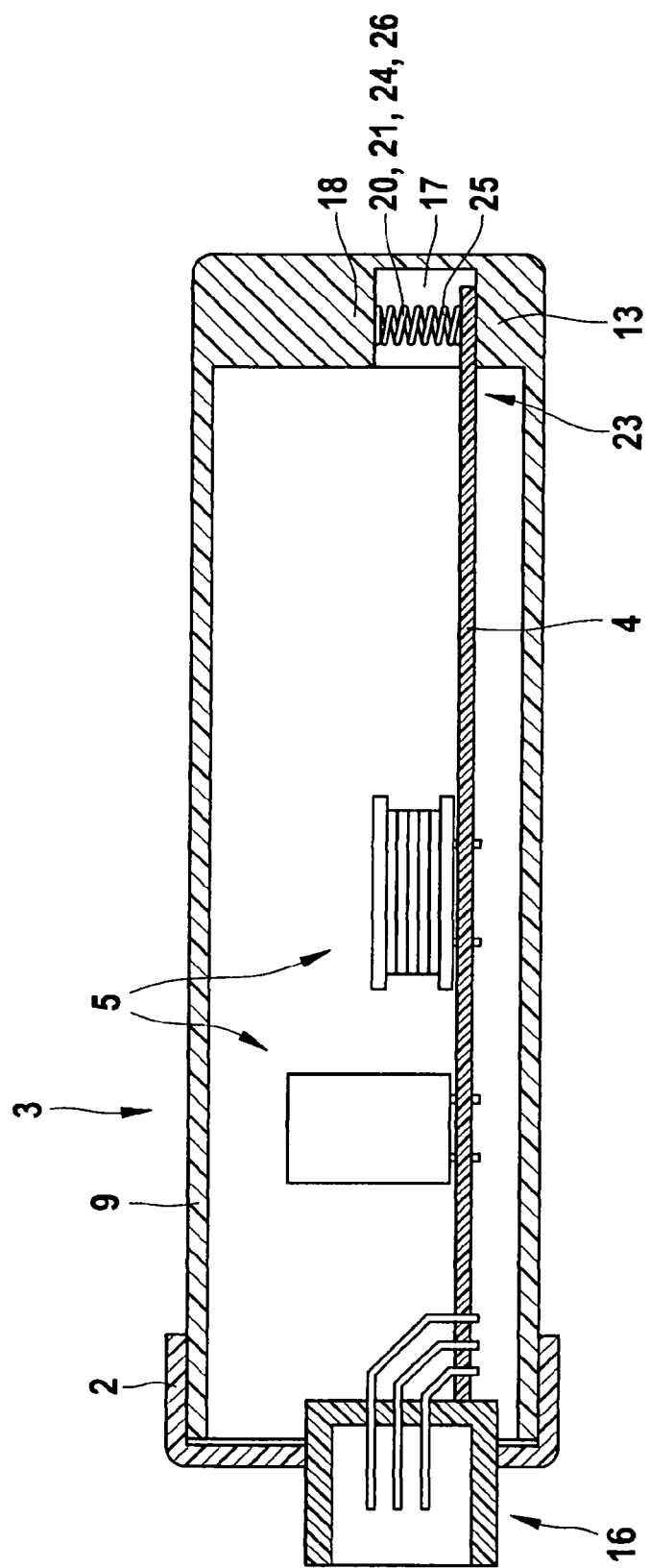
FIG. 3 shows the same housing, the holding means being developed of shape memory alloy material.

FIG. 3 shows the same system, so that in this respect we may refer to FIGS. 1 and 2. However, a spring element 24, made of a shape memory alloy 25, is used in this case as holding means 20 or expansion means 21. Thus, spring element 24 forms a means having shape memory 26, which brings about the abovementioned clamping effect between counter-support 18 on the one side and planar substrate 4, that is supported on support 13 on the other side. As a result, in the abovementioned manner, planar substrate 4 is actuated on one side by the clamping effect of the means having shape memory 26, which is situated in clamping region 17, and by its mechanical connection with contact plug 16, that penetrates housing cover 2 and is connected to it, on the other side, housing cover 2 being slipped onto base housing 9. When using the means having shape memory 26, particularly simple handling may be achieved, just because of the mechanical fixing of planar substrate 4 on housing cover 2 via contact plug 16, since the means having shape memory 26 is activated by temperature action, but planar substrate 4, having electric circuit 5 situated on it, has not yet been inserted into base housing 9. Because of this activation, the means having shape memory 26 begins to change in a manner reaching for space, that is, particularly spring element 24 begins to expand in the axial direction. Before spring element 24 achieves coming to rest on support 13 (that is, the desired extent of the expansion), planar substrate 4 is inserted into base housing 9 using cover 2, by simply turning cover 2 upside down over base housing 9. End 23 of planar substrate 4, in this connection, based on the geometry of base housing 9 and of planar substrate 4, especially based on the respective spatial extension, moves perforce into clamping region 17, where it is acted upon on its upper side by expanding spring element 24. In the clampings of planar substrate 4 using expansion means 21 described, a good and especially also a large-surface support of planar substrate 4 on support 13 comes about, which is able to be developed over a greater extension of base housing 9, and which, in this connection, is still substantially simpler and cheaper to produce than the screw supports or the clipping supports known from the related art. At the same time, the force action over expansion means 21 takes place over a substantially larger surface than would be the case with screw connections or clipping connections, whereby undesired, essentially concentrated mechanical loads on planar substrate 4 are avoided. This assures a fastening of planar substrate 4 within mounting housing 3 that is simple, secure and easy to handle.

What is claimed is:

1. A method for fastening a planar substrate having an electric circuit, comprising:
    positioning the planar substrate in a mounting position on a mounting element;
    positioning a holding arrangement in the vicinity of a fastening region of the planar substrate, wherein the holding arrangement is an expansion arrangement configured to be selectively activated; and
    activating the expansion arrangement to act upon the planar substrate to fasten the planar substrate against the mounting element by compressive force, wherein prior to activation the expansion arrangement is not in contact with the planar substrate,
    wherein the planar substrate is fastened to a housing cover, and wherein the planar substrate is acted upon initially only on its upper side by the holding arrangement at an end opposite the housing cover.

2. The method as recited in claim 1, wherein the planar substrate is acted upon by the expansion arrangement in a clamping manner.

3. The method as recited in claim 2, wherein the activation of the expansion arrangement takes place by at least one of temperature action, vibrational action, application of a gaseous medium, and application of liquid medium.

4. The method as recited in claim 2, wherein the activation of the expansion arrangement takes place as a function of aging of the expansion arrangement.

5. The method as recited in claim 3, wherein a chemical hardening material is used as the expansion arrangement.

6. The method as recited in claim 5, wherein an epoxy foam is used as the expansion arrangement.

7. The method as recited in claim 3, wherein a temperature-activatable arrangement having shape memory is used as the expansion arrangement.

8. The method as recited in claim 3, wherein a shape memory alloy is used as the expansion arrangement.

9. The method as recited in claim 3, wherein a spring element made of a shape memory alloy material is used as the expansion arrangement.

10. A device for fastening a planar substrate having an electric circuit, comprising:
   a mounting element receiving the planar substrate in a mounting position; and
   a holding arrangement positioned in the vicinity of a fastening region of the planar substrate, wherein the holding arrangement is an expansion arrangement configured to be selectively activated, and wherein the expansion arrangement is configured to act upon the planar substrate to fasten the planar substrate against the mounting element by compressive force, wherein prior to activation the expansion arrangement is not in contact with the planar substrate, wherein the planar substrate is fastened to a housing cover, and wherein the planar substrate is acted upon initially only on its upper side by the holding arrangement at an end opposite the housing cover.

11. The device as recited in claim 10, wherein the mounting element is configured as a mounting housing.

12. The device as recited in claim 11, wherein the mounting housing has a support for at least one surface of the planar substrate, and wherein the holding arrangement acts upon a surface opposite the at least one surface of the planar substrate in a clamping manner.

13. The device as recited in claim 11, wherein the mounting housing has a base housing and the housing cover.

14. The device as recited in claim 13, wherein the planar substrate is acted upon by the holding arrangement in the region of the base housing.

15. The device as recited in claim 11, wherein the base housing has a carved-out region in which the holding arrangement is situated.

* * * * *

UNITED STATES PATENT AND TRADEMARK OFFICE
CERTIFICATE OF CORRECTION

PATENT NO.       : 8,505,891 B2
APPLICATION NO. : 12/451807
DATED            : August 13, 2013
INVENTOR(S)      : Guyenot et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 619 days.

Signed and Sealed this
Fifteenth Day of September, 2015

Michelle K. Lee
*Director of the United States Patent and Trademark Office*